United States Patent
Katayama

(10) Patent No.: US 8,410,533 B2
(45) Date of Patent: *Apr. 2, 2013

(54) SEMICONDUCTOR DEVICE AND METHOD FOR PRODUCING SAME

(75) Inventor: Masaya Katayama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 241 days.

This patent is subject to a terminal disclaimer.

(21) Appl. No.: 12/833,330

(22) Filed: Jul. 9, 2010

(65) Prior Publication Data

US 2011/0024807 A1 Feb. 3, 2011

(30) Foreign Application Priority Data

Jul. 31, 2009 (JP) ................................ 2009-178755

(51) Int. Cl.
*H01L 31/103* (2006.01)
(52) U.S. Cl. ........ 257/292; 257/291; 257/461; 257/431; 257/E31.057; 438/98; 438/45; 438/59
(58) Field of Classification Search .................. 257/462, 257/292, E31.057, 431, 434, 435, 461; 438/98, 438/45, 59
See application file for complete search history.

(56) References Cited

U.S. PATENT DOCUMENTS

| | | | |
|---|---|---|---|
| 6,573,578 B2 * | 6/2003 | Kimura et al. | 257/431 |
| 6,737,291 B1 * | 5/2004 | Lim | 438/45 |
| 7,411,265 B2 * | 8/2008 | Sekiguchi | 257/461 |
| 7,768,087 B2 * | 8/2010 | Katayama | 257/435 |
| 2004/0046194 A1 * | 3/2004 | Kozuka et al. | 257/292 |
| 2009/0001496 A1 * | 1/2009 | Katayama | 257/435 |
| 2009/0239327 A1 * | 9/2009 | Oh et al. | 438/59 |
| 2010/0084729 A1 * | 4/2010 | Steinbrueck et al. | 257/434 |

FOREIGN PATENT DOCUMENTS

| | | | |
|---|---|---|---|
| EP | 1 921 685 | * | 8/2005 |
| KR | 10-2008-0040744 A | | 5/2008 |
| WO | 2007/026409 A1 | | 3/2007 |

OTHER PUBLICATIONS

Korean Office Action dated Jun. 15, 2011, issued in corresponding Korean Patent Application No. 10-2010-0073412.

* cited by examiner

*Primary Examiner* — Thinh T Nguyen
(74) *Attorney, Agent, or Firm* — Westerman, Hattori, Daniels & Adrian, LLP

(57) ABSTRACT

A semiconductor device includes a semiconductor substrate having at least one surface provided with a semiconductor element, wherein the semiconductor substrate includes a region of a first conductivity type, the region being formed in a surface layer portion of the semiconductor substrate; a first diffusion region of a second conductivity type, the first diffusion region having a first impurity concentration and being formed in the surface layer portion, and a pn junction being formed between the first diffusion region and the region of the first conductivity type; and a first metal silicide film formed on part of a portion of the surface corresponding to the first diffusion region.

12 Claims, 16 Drawing Sheets

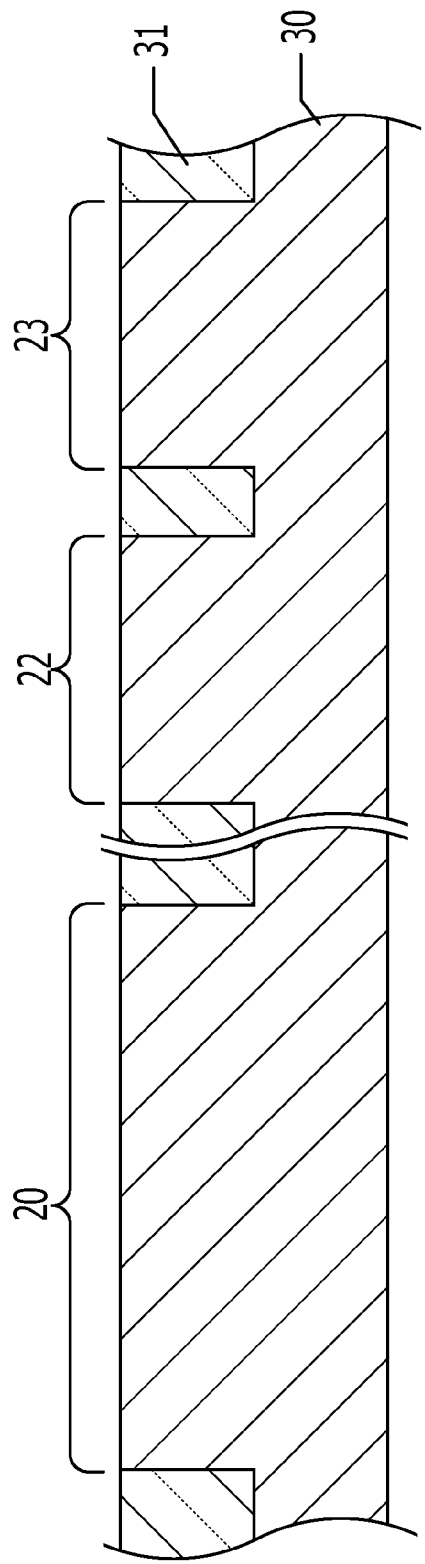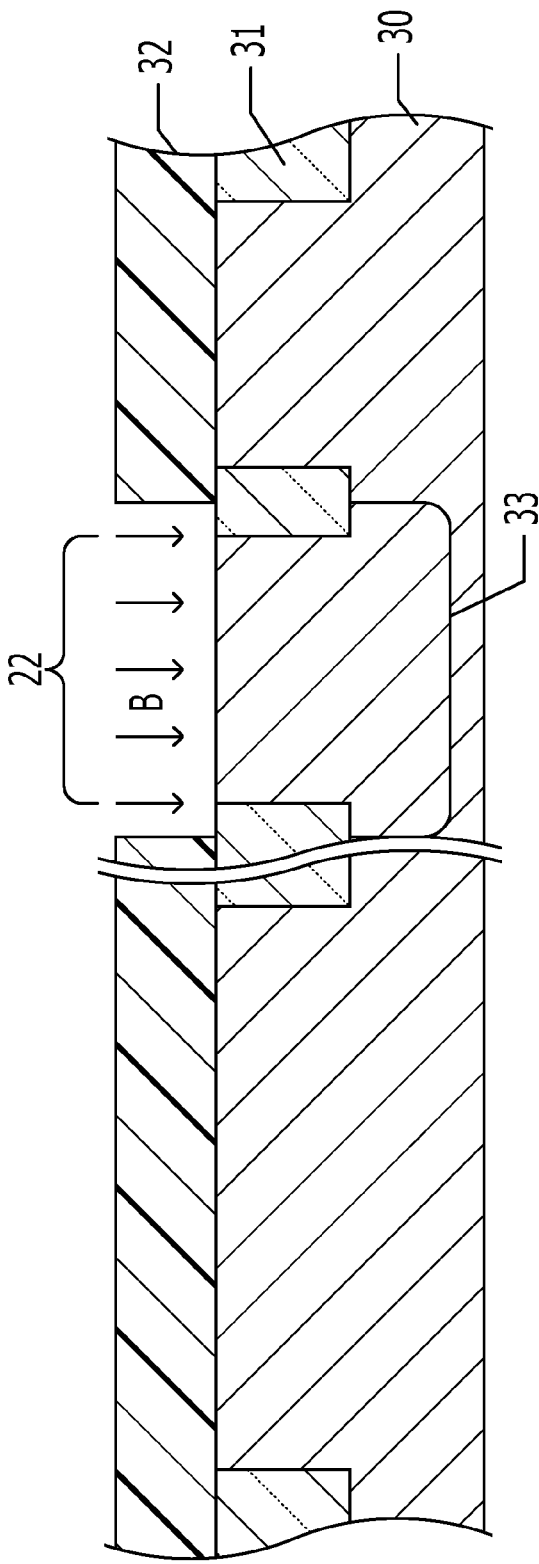

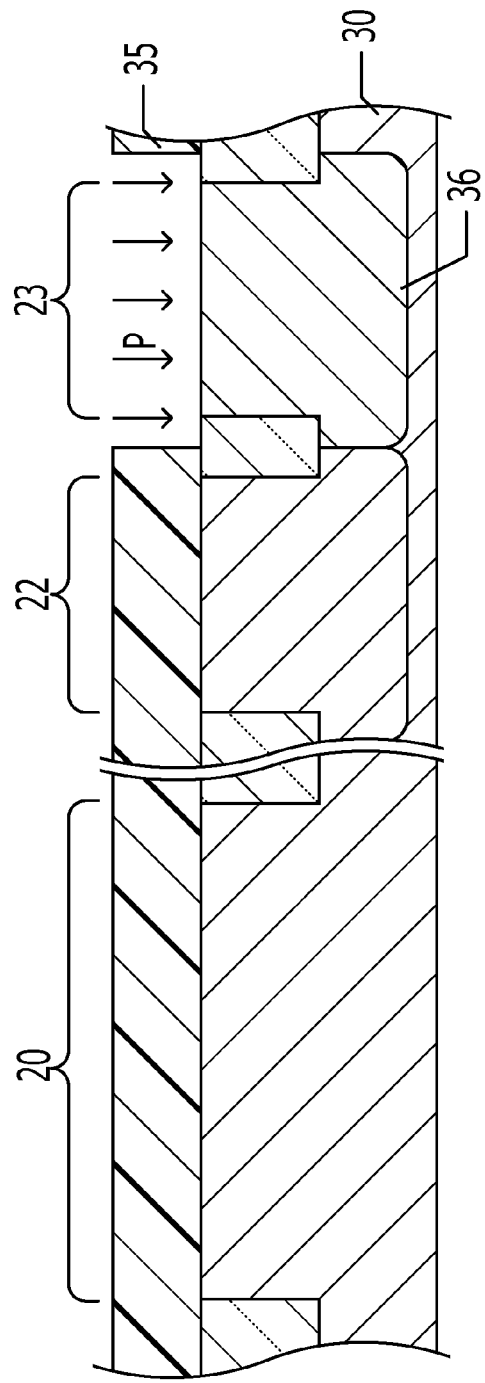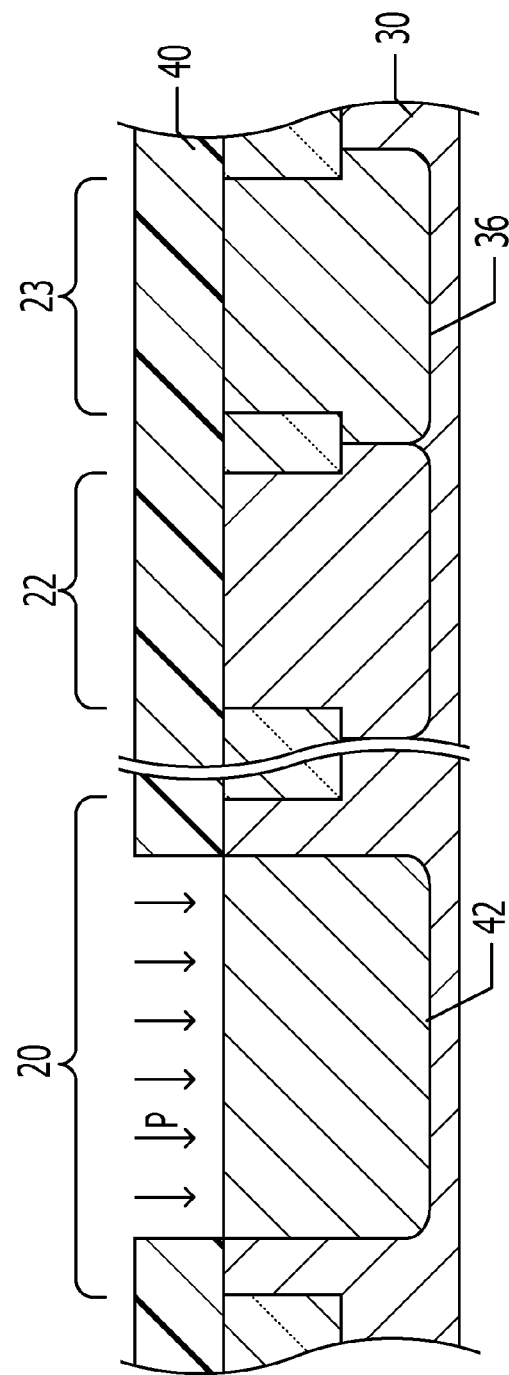

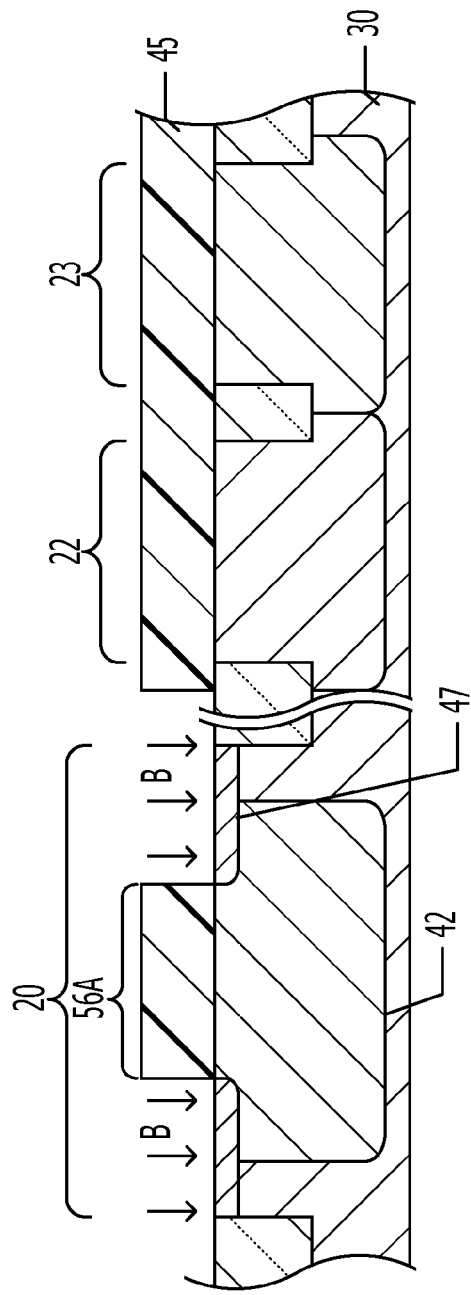
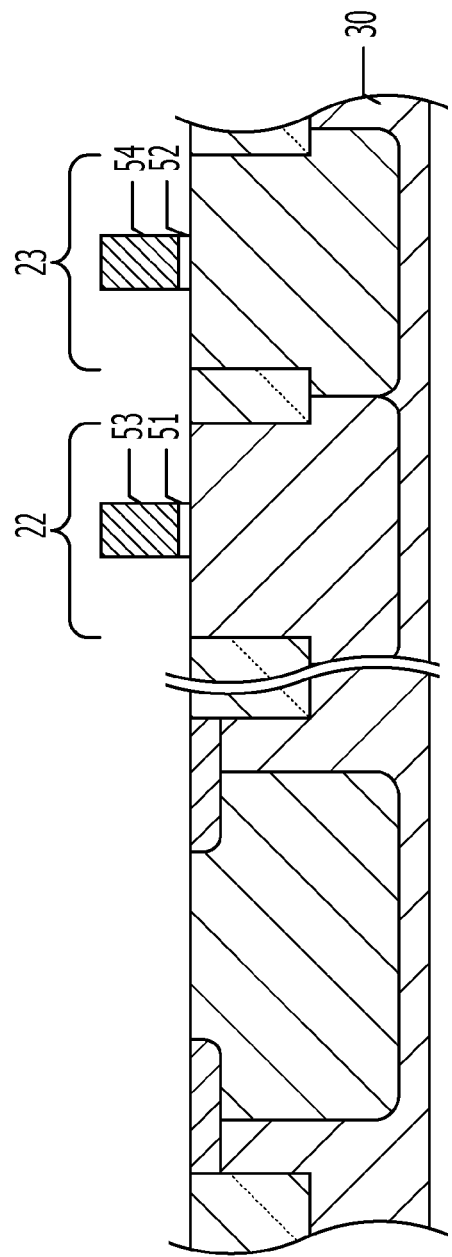

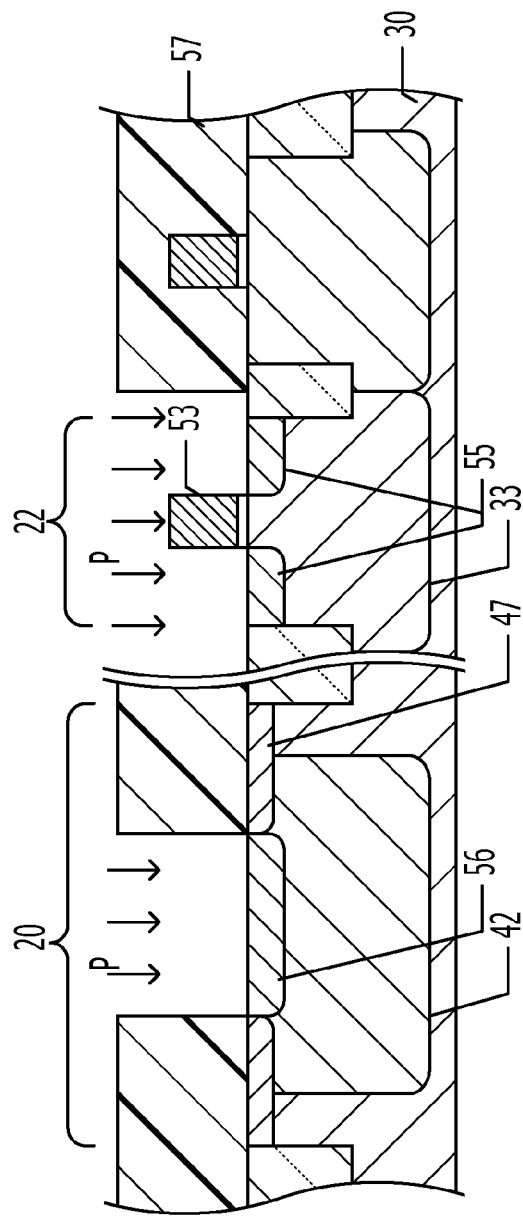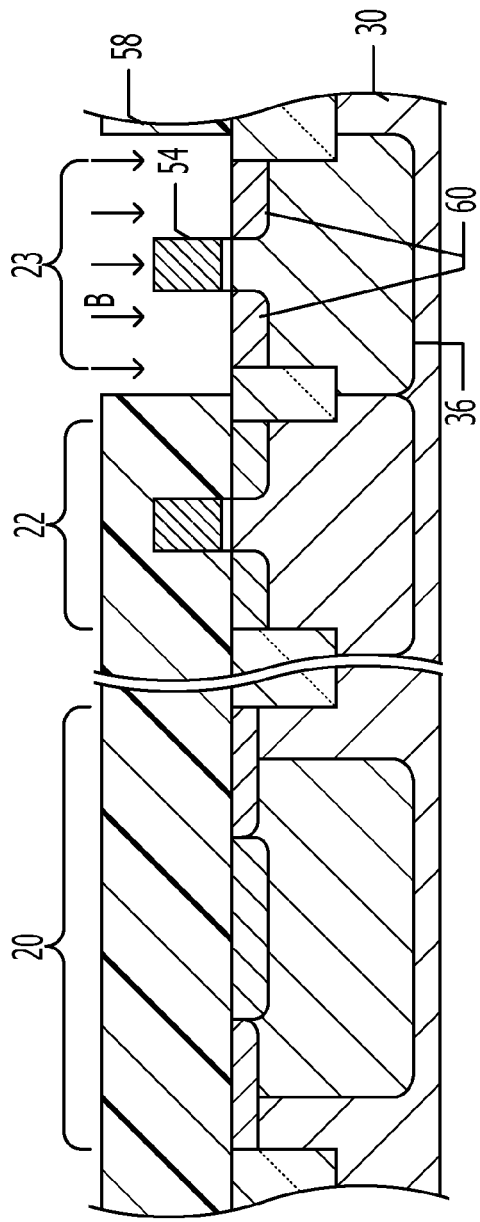

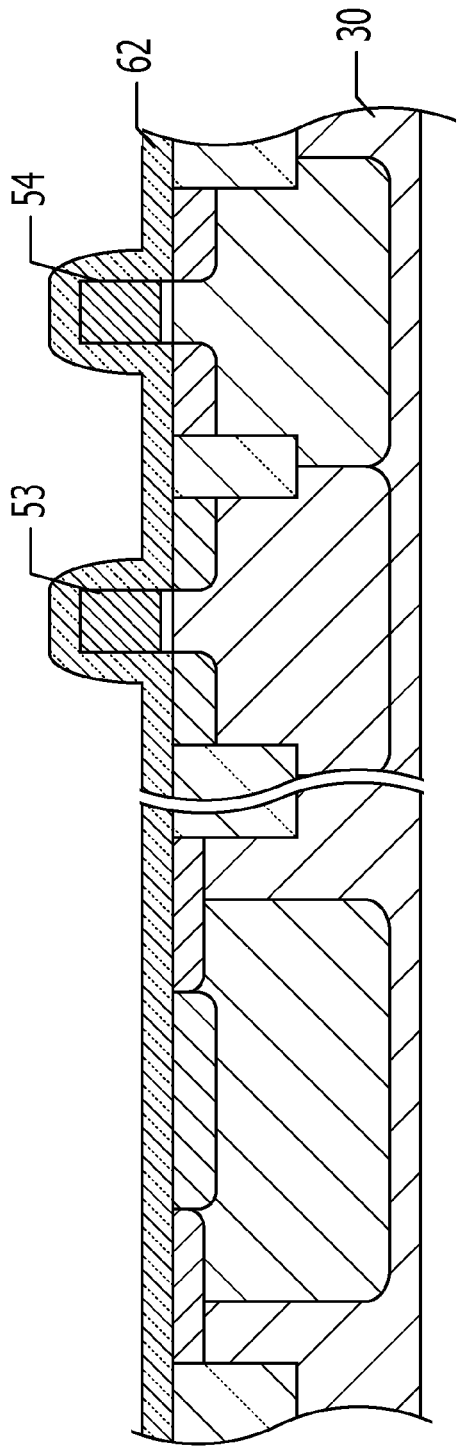
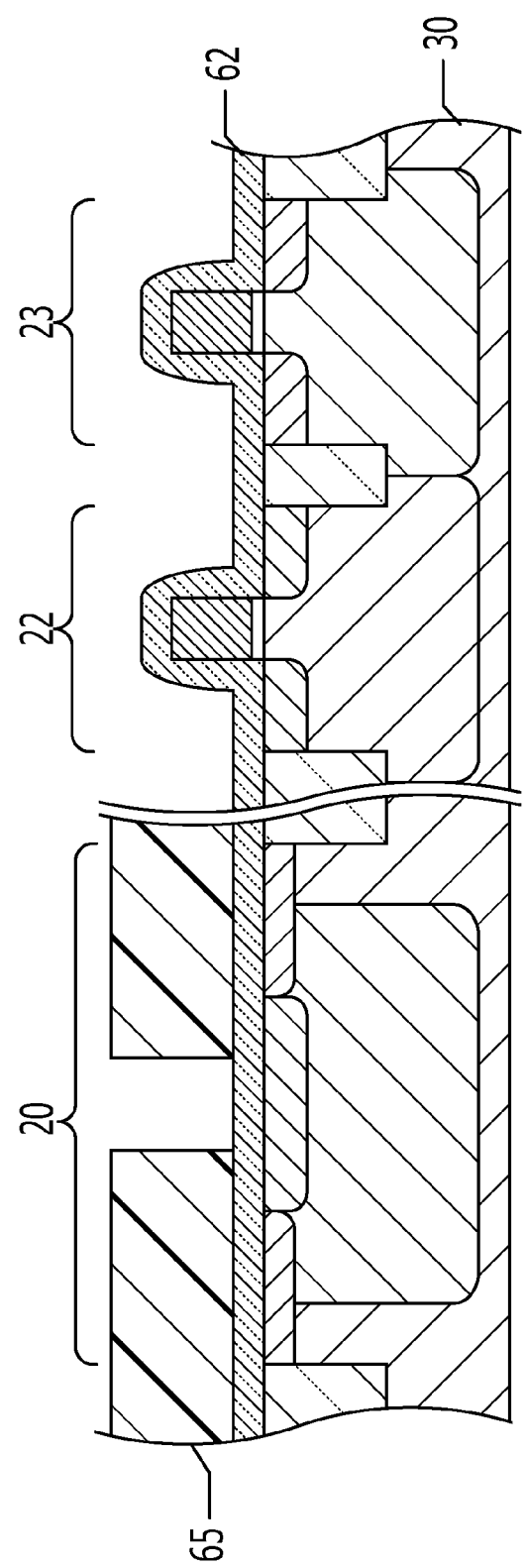

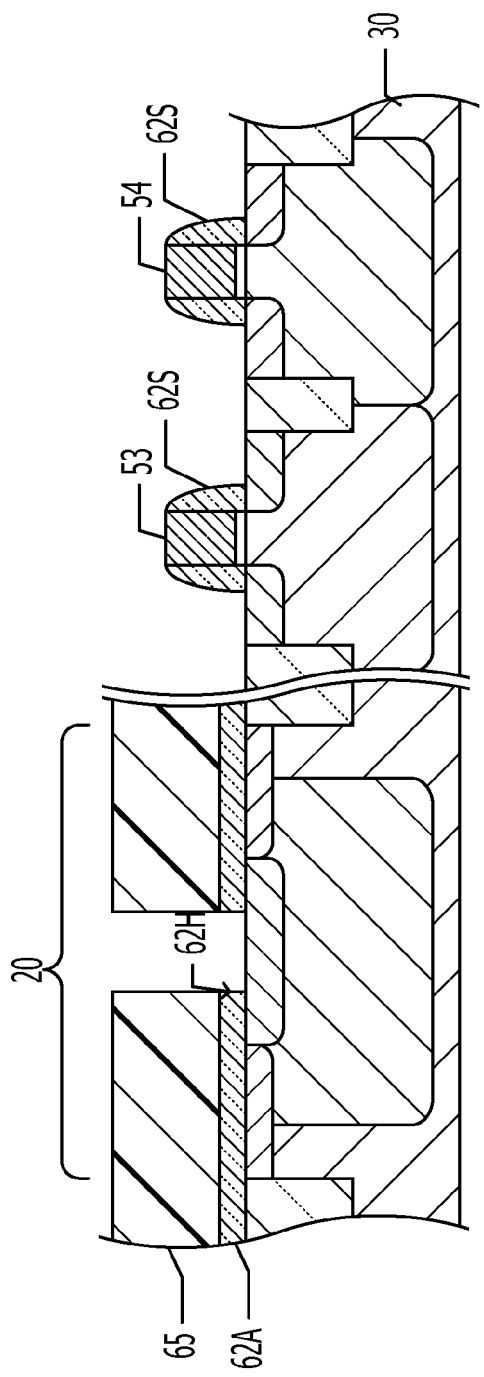
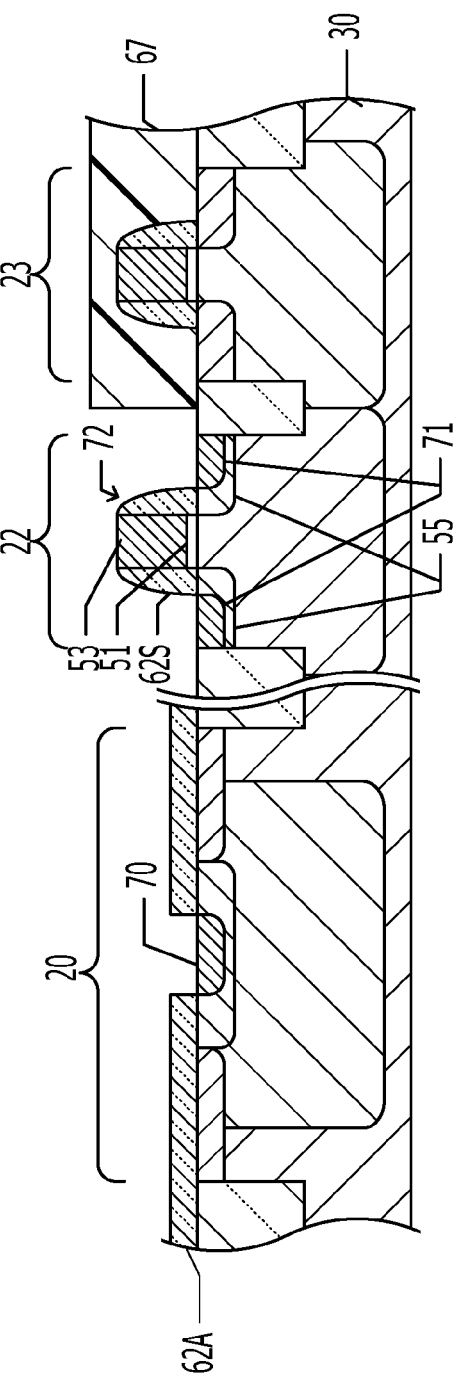

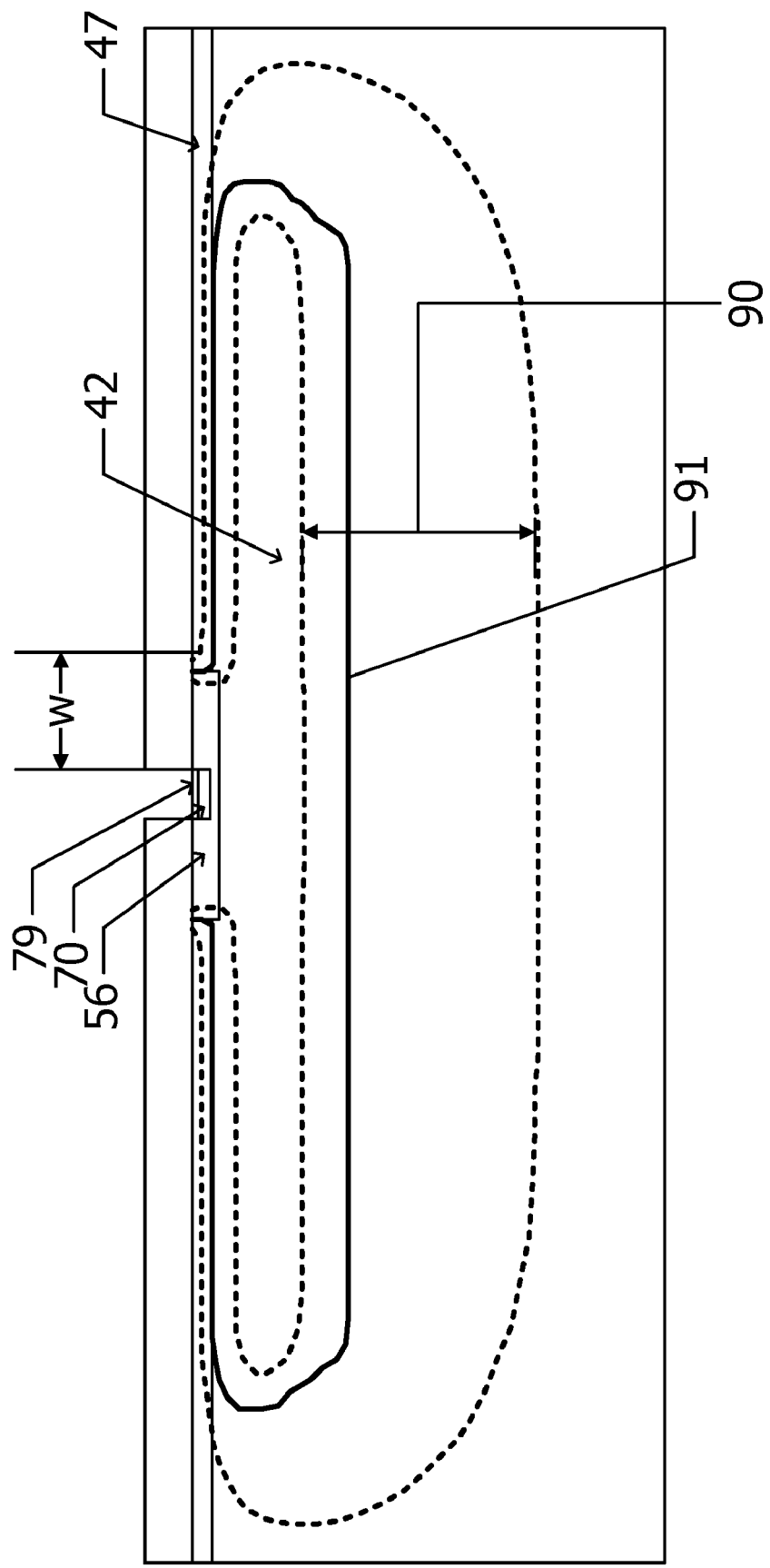

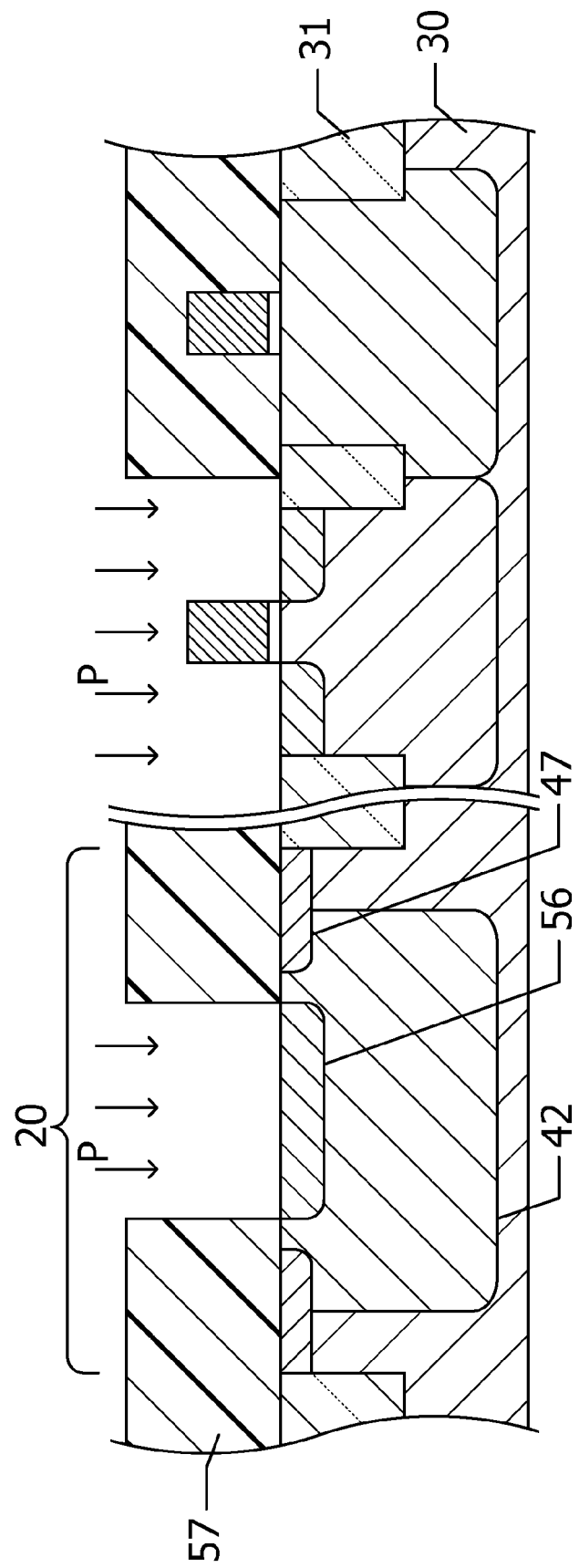

SEMICONDUCTOR DEVICE AND METHOD FOR PRODUCING SAME

CROSS-REFERENCE TO RELATED APPLICATIONS

This application is based upon and claims the benefit of priority of the prior Japanese Patent Application No. 2009-178755, filed on Jul. 31, 2009 the entire contents of which are incorporated herein by reference.

FIELD

The present invention relates to a semiconductor device including a photodiode formed on a surface of a substrate and a method for producing the semiconductor device.

BACKGROUND

To improve the sensitivity of a photodiode, it is desired to suppress leakage current when a reverse bias is applied to a pn junction of the photodiode. The leakage current serves as dark current that flows when light is not incident, leading to a reduction in sensitivity. In the case where a depletion layer formed in applying a reverse bias to the photodiode comes into contact with the interface between a semiconductor material such as silicon and an insulating material such as silicon oxide, leakage current is increased.

To form the ohmic contact between a conductive plug and a diffusion region on a surface side of the photodiode, the impurity concentration in a contact portion is set so as to be higher than that of a portion around the contact portion. For the case where the depletion layer comes into contact with the region with a high impurity concentration, leakage current due to crystal defects in the region with a high impurity concentration is increased.

A region where the interface between the semiconductor material and the insulating material is in contact with the depletion layer is localized around the contact portion, thereby suppressing the leakage current. Furthermore, the prevention of the extension of the depletion layer to the region with a high impurity concentration suppresses the leakage current.

A metal silicide film is often formed on surfaces of the source and the drain of a MOS transistor. Meanwhile, a metal silicide film is not formed on a contact portion of a photodiode in the related art. Different etching conditions in forming via holes in an interlayer insulation film are used for a portion where the metal silicide film is formed and a portion where the metal silicide film is not formed. Thus, two etching steps of forming the via holes are performed. In a second step of forming the via holes, the via holes that have been formed are filled with a mask material such as a resist. For example, residues of the mask material cause a reduction in yield.

A high-concentration region located at a contact portion of the diffusion region on the surface side of the photodiode is formed by ion implantation through a via hole passing through the interlayer insulation film. In this method, after the step of forming the interlayer insulation film, it is necessary to perform a heat-treatment step in order to activate impurity ions. The impurity ions in an impurity diffusion region that has been formed are diffused again during the heat treatment, thereby changing element properties. In the case of the change in element properties, circuit-design assets, such as various parameters for an existing circuit simulator and logic macros, are not used.

SUMMARY

According to one aspect of the invention, a semiconductor device includes a semiconductor substrate having at least one surface provided with a semiconductor element, wherein the semiconductor substrate includes a region of a first conductivity type, the region being formed in a surface layer portion of the semiconductor substrate; a first diffusion region of a second conductivity type, the first diffusion region having a first impurity concentration and being formed in the surface layer portion, and a pn junction being formed between the first diffusion region and the region of the first conductivity type; a first metal silicide film formed on part of a portion of the surface corresponding to the first diffusion region; and a shielding layer of the first conductivity type, the shielding layer being formed so as to be separated from the first metal silicide film and so as to surround the first metal silicide film, and a pn junction being formed between the shielding layer and the first diffusion region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating the simulation results of the depletion layer generated in a photodiode of a semiconductor device according to the first embodiment;

FIG. 7A is a cross-sectional view of a semiconductor device in the course of production by a method for producing a semiconductor device according to a second embodiment.

DETAILED DESCRIPTION OF THE EMBODIMENT

Figure 1A:
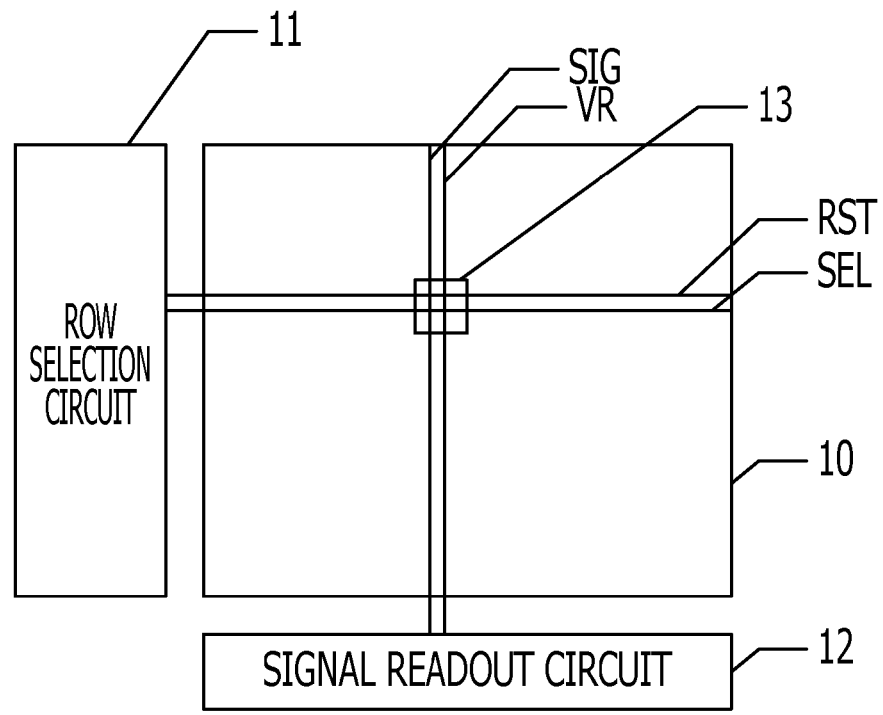
FIG. 1A is a planar layout of an image pickup device including a semiconductor device according to a first embodiment.

FIG. 1A illustrates the layout of an image pickup device including a semiconductor device according to a first embodiment. A plurality of pixels 13 are arrayed in a matrix in an image pickup region 10. A reset control line RST and a selection control line SEL are arranged, corresponding to the row of each of the pixels 13. A reset voltage line VR and a signal line SIG are arranged, corresponding to the column of each of the pixels 13. A row selection circuit 11 sends a reset signal to the reset control line RST and sends a selection signal to the selection control line SEL. A signal readout circuit (reset voltage applying circuit) 12 applies a reset voltage to the reset voltage line VR and reads an electric signal appearing on the signal line SIG.

Figure 1B:
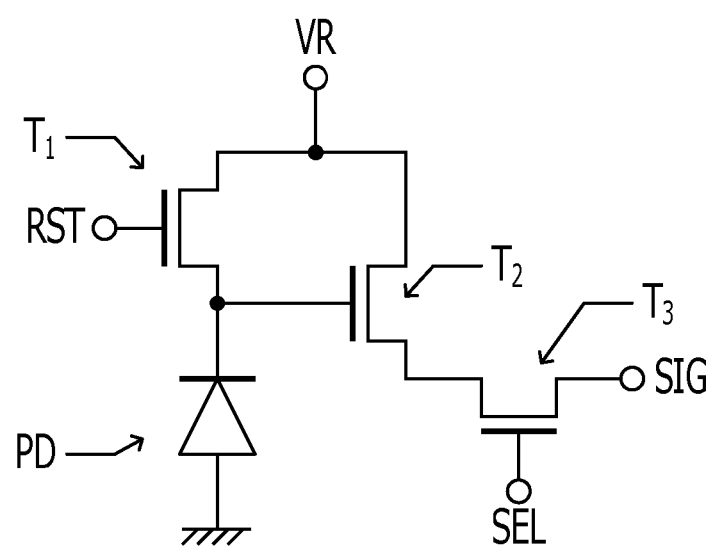
FIG. 1B is an equivalent circuit diagram of one pixel.

FIG. 1B is an equivalent circuit diagram of one pixel 13. The anode of a photodiode PD is grounded. The cathode of the photodiode PD is connected to the reset voltage line VR through a reset transistor $T_1$. The gate electrode of the reset transistor $T_1$ is connected to the reset control line RST. When the reset transistor $T_1$ conducts, a reset voltage is applied to the photodiode PD, the photodiode PD is reset.

A readout transistor $T_2$ is connected to the reset voltage line VR to constitute a source follower circuit. A signal charge accumulated in the cathode of the photodiode PD is converted into a voltage by the readout transistor $T_2$. This voltage is supplied to the signal line SIG through a selection transistor $T_3$. The gate electrode of the selection transistor $T_3$ is connected to the selection control line SEL.

Figure 2:
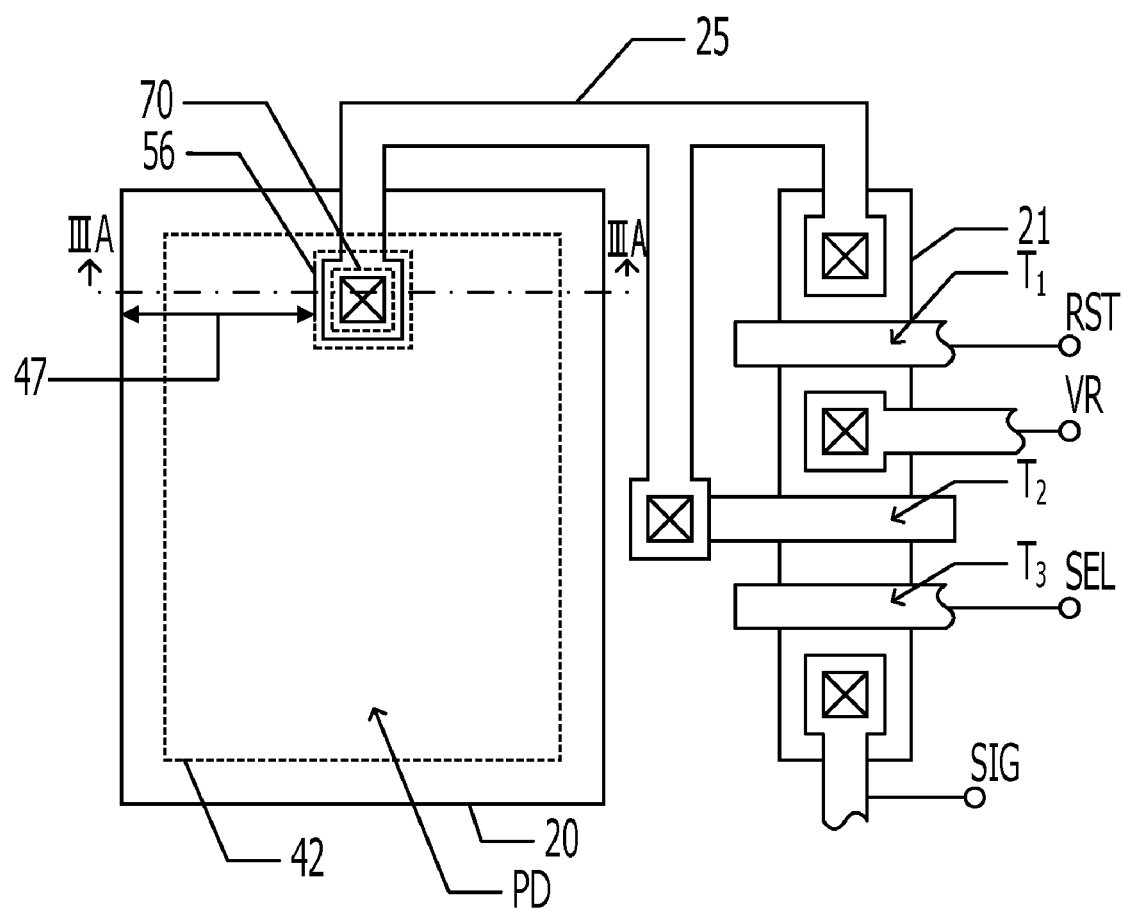
FIG. 2 is a plan view of one pixel.

FIG. 2 is a plan view of one pixel. A MOS active region 21 is arranged on a side of a photodiode active region 20. The photodiode PD is arranged in the photodiode active region 20. An n-type first diffusion region 42 is arranged in the photodiode active region 20. The circumferential line of the n-type first diffusion region 42 is arranged inside the circumferential line of the photodiode active region 20. The n-type first diffusion region 42 is arranged in a p-type region of a semiconductor substrate. An interface between the p-type region of the semiconductor substrate and the n-type first diffusion region 42 is a pn-junction interface.

An n-type second diffusion region 56 is arranged in the n-type first diffusion region 42. An n-type third diffusion region 70 is arranged in the n-type second diffusion region 56. A p-type shielding layer 47 is arranged on a surface of the photodiode active region 20 and outside the circumferential line of the n-type second diffusion region 56. The shielding layer 47 is sufficiently shallower than the first diffusion region 42. On a surface of the photodiode active region 20, an inner portion of the second diffusion region 56 is an n-type portion, and an outer portion of the second diffusion region 56 is a p-type portion. That is, the circumferential line of the second diffusion region 56 is a pn junction interface.

The dimensions of the second diffusion region 56 are smaller than the photodiode active region 20 in plan view. Thus, the length of the pn junction interface that appears on the surface of the photodiode active region 20 is sufficiently shorter than the length of the circumference of the photodiode active region 20. The application of a reverse bias to the photodiode PD forms a depletion layer along the pn junction interface. The depletion layer that appears on the surface of the photodiode active region 20 is localized in the vicinity of the circumferential line of the n-type second diffusion region 56.

The reset transistor $T_1$, the readout transistor $T_2$, and the selection transistor $T_3$ are aligned, in that order, in the MOS active region 21. A lead 25 connects the third diffusion region 70, the gate electrode of the readout transistor $T_2$, and the source of the reset transistor $T_1$ to each other.

The drain of the reset transistor $T_1$ and the drain of the readout transistor $T_2$ are formed of one n-type diffusion region and connected to the reset voltage line VR. The source of the readout transistor $T_2$ and the drain of the selection transistor $T_3$ are formed of one n-type diffusion region. The source of the selection transistor $T_3$ is connected to the signal line SIG.

Figure 3:
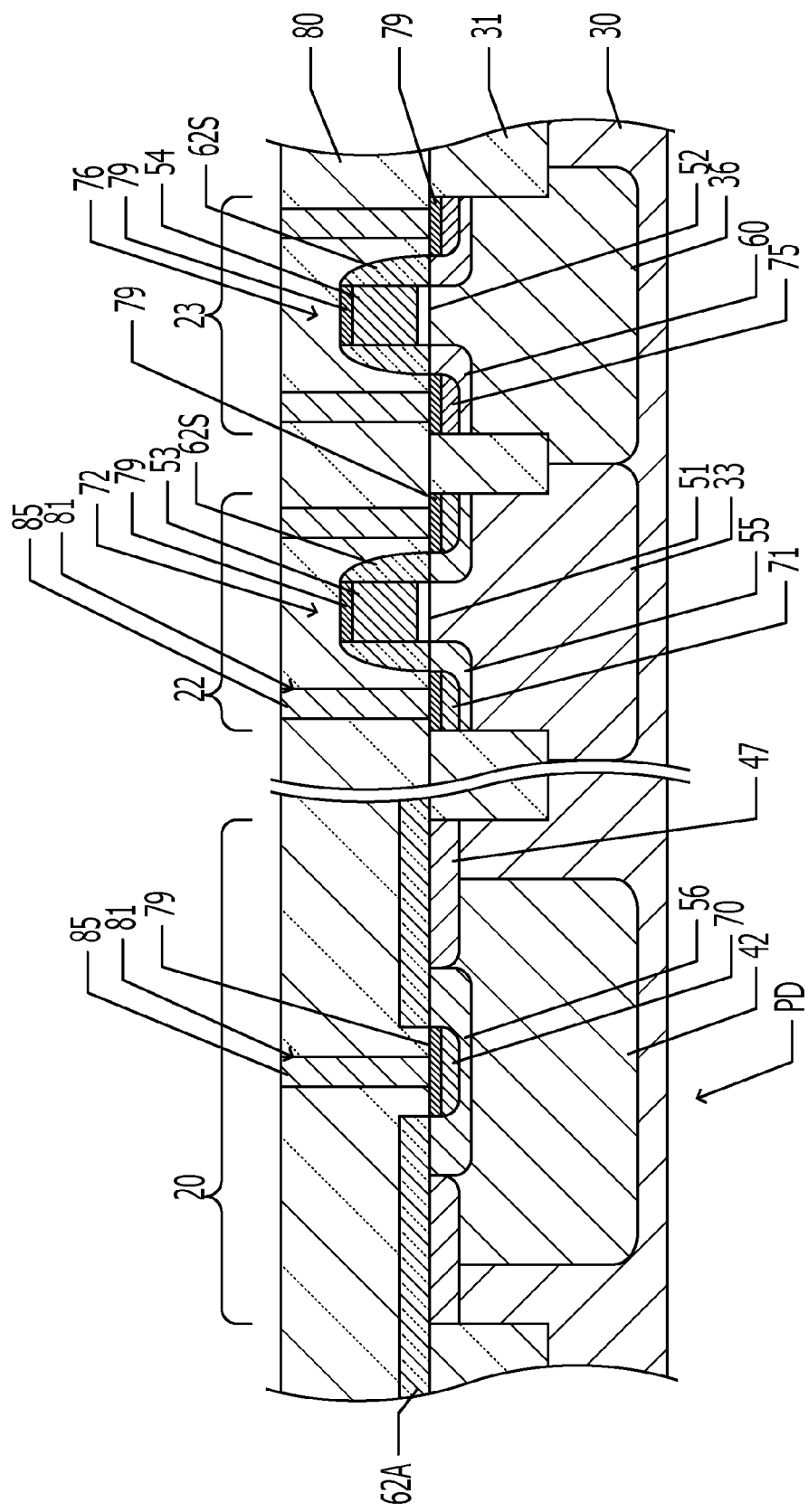
FIG. 3 is a cross-sectional view of a semiconductor device according to the first embodiment.

FIG. 3 is a cross-sectional view of a semiconductor device according to the first embodiment. FIG. 3 is a cross-sectional view of the photodiode PD, an NMOS transistor, and a PMOS transistor. The cross-sectional view of the photodiode PD corresponds to a cross-sectional view taken along the alternate long and short dashed line IIIA-IIIA in FIG. 2. The NMOS transistor and the PMOS transistor are not illustrated in the plan view of FIG. 2.

An element isolation insulating film 31 is formed in a surface portion of a semiconductor substrate 30. The semiconductor substrate 30 is composed of, for example, p-type silicon. The element isolation insulating film 31 is formed by, for example, shallow trench isolation (STI). The element isolation insulating film 31 defines the photodiode active region 20, an NMOS active region 22, and a PMOS active region 23.

The n-type first diffusion region 42 is formed in the photodiode active region 20. The n-type first diffusion region 42 is spaced apart from the element isolation insulating film 31. The n-type second diffusion region 56 is formed in part of a surface portion of the n-type first diffusion region 42. The concentration of an n-type impurity in the second diffusion region 56 is higher than that of the first diffusion region 42. The p-type shielding layer 47 is formed in a surface portion of the substrate extending from the circumferential line of the n-type second diffusion region 56 to edges of the photodiode active region 20. The shielding layer 47 is shallower than the n-type first diffusion region 42.

The n-type third diffusion region 70 is formed in part of a surface portion of the second diffusion region 56. The concentration of an n-type impurity in the third diffusion region 70 is higher than that of the second diffusion region 56. A metal silicide film 79 is formed on a surface of the n-type third diffusion region 70.

The first diffusion region 42 serves as the cathode of the photodiode PD. The p-type region in the semiconductor substrate 30 located around the first diffusion region 42 serves as the anode of the photodiode PD. A depletion layer formed in applying a reverse bias to the pn junction of the photodiode PD serves as a light-receiving region. The p-type region in the semiconductor substrate 30 is grounded as illustrated in FIG. 1B in a region other than the region illustrated in the cross-sectional view of FIG. 3.

A NMOS transistor 72 is formed in the NMOS active region 22. The NMOS transistor 72 includes a gate insulating film 51, a gate electrode 53, high concentration portions 71 of a source and a drain, and an extension portion 55. A gate pattern in which the gate insulating film 51 and the gate electrode 53 are stacked intersects the NMOS active region 22 in plan view. A PMOS transistor 76 is formed in the PMOS active region 23. The PMOS transistor 76 includes a gate insulating film 52, a gate electrode 54, high concentration portions 75 of a source and a drain, and an extension portion 60. A gate pattern in which the gate insulating film 52 and the gate electrode 54 are stacked intersects the PMOS active region 23 in plan view.

Sidewall spacers 62S are formed on the sides of each of the gate electrodes 53 and 54. The metal silicide films 79 are formed on the top surfaces of the high concentration portions 71 and 75 of the sources and the drains and the top surfaces of the gate electrodes 53 and 54.

An interlayer insulation film 80 is formed on the semiconductor substrate 30 so as to cover the NMOS transistor 72, the PMOS transistor 76, and the photodiode PD. A plurality of via holes 81 that allow the metal silicide films 79 to be exposed therethrough are formed in the interlayer insulation film 80. The via holes 81 are filled with conductive plugs 85.

A method for producing a semiconductor device according to the first embodiment will be described below with reference to FIGS. 4A to 4O.

As illustrated in FIG. 4A, the element isolation insulating regions 31 are formed in a surface layer portion of the semiconductor substrate 30 composed of p-type silicon. Shallow trench isolation (STI) may be employed as the element isolation insulating regions 31. Each of the element isolation insulating regions 31 has a depth of, for example, 200 nm to 400 nm. Note that local oxidation of silicon (LOCOS) may be employed in place of STI.

The element isolation insulating regions 31 define a plurality of active regions, for example, the photodiode active region 20, the NMOS active region 22, and the PMOS active region 23.

As illustrated in FIG. 4B, a resist pattern (mask pattern) 32 having an opening corresponding to the NMOS active region 22 is formed on the semiconductor substrate 30. Boron (B) is implanted into a surface layer portion of the NMOS active region 22 with the resist pattern 32 as a mask to form a p-type well 33. Boron is implanted at, for example, an acceleration energy of 100 keV to 300 keV and a dose of $1\times10^{13}$ cm$^{-2}$ to $5\times10^{13}$ cm$^{-2}$. After the formation of the p-type well 33, the resist pattern 32 is removed.

As illustrated in FIG. 4C, a resist pattern (mask pattern) 35 having an opening corresponding to the PMOS active region 23 is formed on the semiconductor substrate 30. Phosphorus (P) is implanted into the PMOS active region 23 with the resist pattern 35 as a mask to form an n-type well 36. Phosphorus is implanted at, for example, an acceleration energy of 200 keV to 500 keV and a dose of $1\times10^{13}$ cm$^{-2}$ to $5\times10^{13}$ cm$^{-2}$. After the formation of the n-type well 36, the resist pattern 35 is removed.

As illustrated in FIG. 4D, a resist pattern (mask pattern) 40 having an opening corresponding to the n-type first diffusion region 42 illustrated in FIG. 2 is formed on the semiconductor substrate 30. The circumference of the opening is located inside the circumference of the photodiode active region 20. Phosphorus (P) is implanted into a surface layer portion of the photodiode active region 20 with the resist pattern 40 as a mask to form the n-type first diffusion region 42. Phosphorus is implanted at, for example, an acceleration energy of 200 keV to 1000 keV and a dose of $1\times10^{12}$ cm$^{-2}$ to $5\times10^{13}$ cm$^{-2}$. After the formation of the n-type first diffusion region 42, the resist pattern 40 is removed. In the case where the n-type well 36 and the n-type first diffusion region 42 are formed under the same implantation conditions, both may be formed in one ion implantation step.

As illustrated in FIG. 4E, a resist pattern (mask pattern) 45 is formed on the semiconductor substrate 30. The resist pattern 45 covers the NMOS active region 22 and the PMOS active region 23. In the photodiode active region 20, the resist pattern 45 covers a first region 56A corresponding to the n-type second diffusion region 56 illustrated in FIG. 2 and allows a region corresponding to the p-type shielding layer 47 to be exposed therethrough.

Boron (B) is implanted into the surface layer portion of the photodiode active region 20 with the resist pattern 45 as a mask to form the p-type shielding layer 47. Boron is implanted at, for example, an acceleration energy of 10 keV to 40 keV and a dose of $1\times10^{12}$ cm$^{-2}$ to $5\times10^{13}$ cm$^{-2}$. The shielding layer 47 is shallower than the first diffusion region 42. After the formation of the shielding layer 47, the resist pattern 45 is removed.

As illustrated in FIG. 4F, the gate insulating film 51 and the gate electrode 53 are formed on the semiconductor substrate 30 so as to intersect the NMOS active region 22. Simultaneously, the gate insulating film 52 and the gate electrode 54 are formed on the semiconductor substrate 30 so as to intersect the PMOS active region 23. Each of the gate insulating films 51 and 52 is composed of, for example, silicon oxide and has a thickness of, for example, 2 nm to 8 nm. Each of the gate electrodes 53 and 54 is composed of, for example, polycrystalline silicon and has a thickness of, for example, 100 nm. For example, thermal oxidation is employed for the formation of the gate insulating films 51 and 52. For example, chemical vapor deposition (CVD) is employed for the formation of the gate electrodes 53 and 54. Note that plural types of gate insulating films having different thicknesses may be formed on one semiconductor substrate 30 in response to required device characteristics.

As illustrated in FIG. 4G, a resist pattern (mask pattern) 57 is formed on the semiconductor substrate 30. The resist pattern 57 covers the PMOS active region 23 and allows the NMOS active region 22 to be exposed therethrough. In the photodiode active region 20, the resist pattern 57 covers the shielding layer 47 and has an opening corresponding to the second diffusion region 56.

Phosphorus (P) is implanted into the surface layer portion of the semiconductor substrate 30 with the resist pattern 57 as a mask. Phosphorus is implanted at, for example, an acceleration energy of 20 keV to 50 keV and a dose of $1\times10^{13}$ cm$^{-2}$ to $1\times10^{14}$ cm$^{-2}$. In the photodiode active region 20, the n-type second diffusion region 56 is formed in a surface layer portion of the n-type first diffusion region 42. In the NMOS active region 22, the n-type extension portions 55 of the source and the drain are formed in a surface layer portion of the p-type well 33 on both sides of the gate electrode 53. After the implantation of phosphorus, the resist pattern 57 is removed.

The extension portion 55 and the second diffusion region 56 contain the same impurity in the same concentration and have the same depth.

The second diffusion region 56 is shallower than the first diffusion region 42. Although FIG. 4G illustrates an example of the case where the second diffusion region 56 is deeper than the shielding layer 47, the second diffusion region 56 may be shallower than the shielding layer 47. The outer periphery of the second diffusion region 56 is almost in contact with the inner periphery of the shielding layer 47. In the case where misregistration within the allowable range occurs in forming the resist pattern 57, the second diffusion region 56 overlaps the shielding layer 47 in part of the circumferential line of the second diffusion region 56, and both are separated from each other in other portions. However, misregistration within the allowable range does not adverse affect the operation of the photodiode PD.

As illustrated in FIG. 4H, a resist pattern (mask pattern) 58 is formed on the semiconductor substrate 30. The resist pattern 58 covers the photodiode active region 20 and the NMOS active region 22 and allows the PMOS active region 23 to be exposed therethrough. Boron (B) is implanted into the surface layer portion of the semiconductor substrate 30 with the resist pattern 58 as a mask. Boron is implanted at, for example, acceleration energy of 5 keV to 20 keV and a dose of $1\times10^{13}$ cm$^{-2}$ to $1\times10^{14}$ cm$^{-2}$. Thereby, the p-type extension portions 60 of the source and the drain are formed in a surface layer portion of the n-type well 36 on both sides of the gate electrode 54. After the formation of the extension portions 60, the resist pattern 58 is removed.

As illustrated in FIG. 4I, an insulating film 62 composed of an insulating material, e.g., silicon oxide, silicon nitride, or silicon oxynitride, is formed on the semiconductor substrate 30. The insulating film 62 has a thickness of, for example, 100 nm. For example, CVD may be employed for the formation of the insulating film 62. The gate electrodes 53 and 54 are covered with the insulating film 62.

As illustrated in FIG. 4J, a resist pattern (mask pattern) 65 is formed on the insulating film 62. The resist pattern 65 allows the NMOS active region 22 and the PMOS active region 23 to be exposed therethrough. In the photodiode active region 20, the resist pattern 65 has an opening corresponding to the third diffusion region 70 illustrated in FIG. 2 and covers a region outside the third diffusion region 70.

As illustrated in FIG. 4K, the insulating film 62 is subjected to anisotropic etching with the resist pattern 65 as an etching mask. For example, reactive ion etching (RIE) may be employed for the anisotropic etching of the insulating film 62. The sidewall spacers 62S are left on the sides of each of the gate electrodes 53 and 54. Furthermore, in the photodiode active region 20, an insulating pattern 62A having an opening 62H corresponding to the third diffusion region 70 is left. After the anisotropic etching, the resist pattern 65 is removed.

As illustrated in FIG. 4L, a resist pattern (mask pattern) 67 that covers the PMOS active region 23 is formed. The photodiode active region 20 and the NMOS active region 22 are exposed. Phosphorus (P) is implanted into the surface layer portion of the semiconductor substrate 30 using the insulating pattern 62A, the sidewall spacers 62S, the gate electrode 53, and the resist pattern 67 as masks. Phosphorus is implanted at, for example, an acceleration energy of 5 keV to 25 keV and a dose of $1 \times 10^{14}$ cm$^{-2}$ or more. This implantation conditions are set in such a manner that impurity ions do not permeate the insulating pattern 62A on the photodiode active region 20. After the implantation of phosphorus, the resist pattern 67 is removed. Alternatively, arsenic (As) may be implanted in place of phosphorus.

This ion implantation forms the n-type third diffusion region 70 in the surface layer portion of the photodiode active region 20. Furthermore, the high concentration portions 71 of the source and the drain are formed on the surface layer portion of the NMOS active region 22. The high concentration portions 71 and the third diffusion region 70 contain the same impurity in the same concentration and have the same depth. Thereby, the NMOS transistor 72 including the high concentration portions 71 of the source and the drain, the extension portions 55, the gate insulating film 51, and the gate electrode 53 is provided.

Figure 4M:
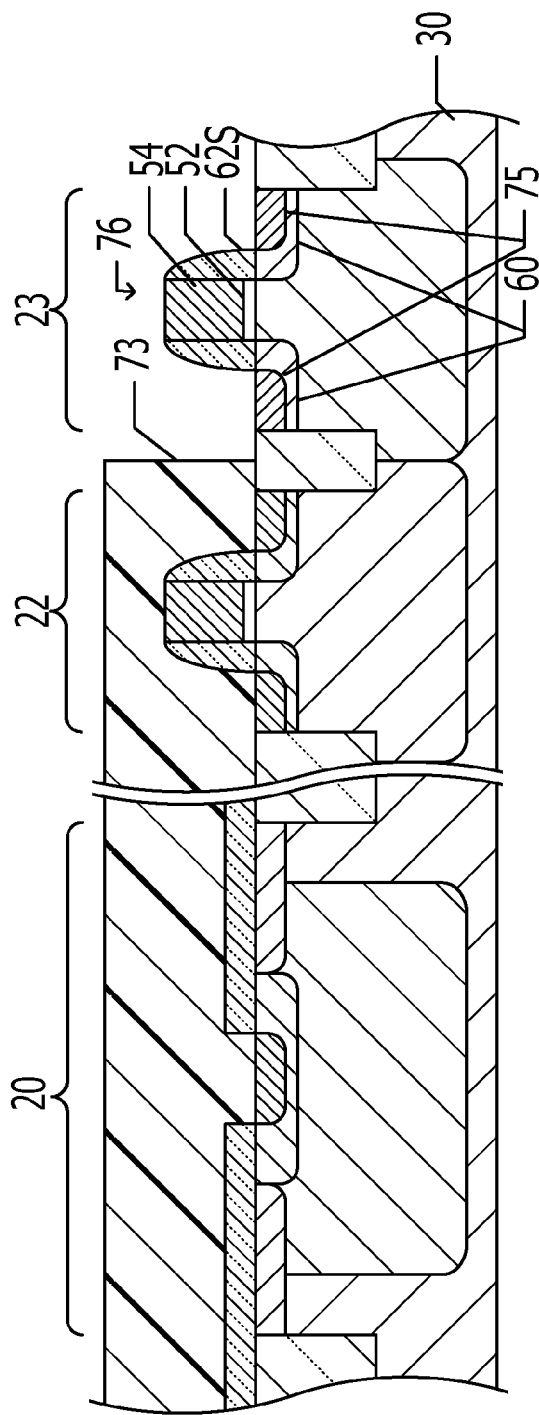
FIGS. 4A to 4O are cross-sectional views of a semiconductor device in the course of production by a method for producing a semiconductor device according to the first embodiment.

As illustrated in FIG. 4M, a resist pattern (mask pattern) 73 is formed on the semiconductor substrate 30. The mask pattern 73 covers the photodiode active region 20 and the NMOS active region 22 and allows the PMOS active region 23 to be exposed therethrough. Boron (B) is implanted into the surface layer portion of the semiconductor substrate 30 using the resist pattern 73, the gate electrode 54, and the sidewall spacers 62S as masks. Boron is implanted at, for example, an acceleration energy of 3 keV to 20 keV and a dose of $1 \times 10^{15}$ cm$^{-2}$ or more. After the implantation of boron, the resist pattern 73 is removed.

The implantation of boron forms the high concentration portions 75 of the source and the drain in the surface layer portion of the PMOS active region 23. Thereby, the PMOS transistor 76 including the high concentration portions 75, the extension portion 60, the gate insulating film 52, and the gate electrode 54 is provided.

After the removal of the resist pattern 73, annealing is performed to activate the implanted impurity. For example, this annealing is performed at 1000° C. for 1 second in a nitrogen atmosphere.

Figure 4N:
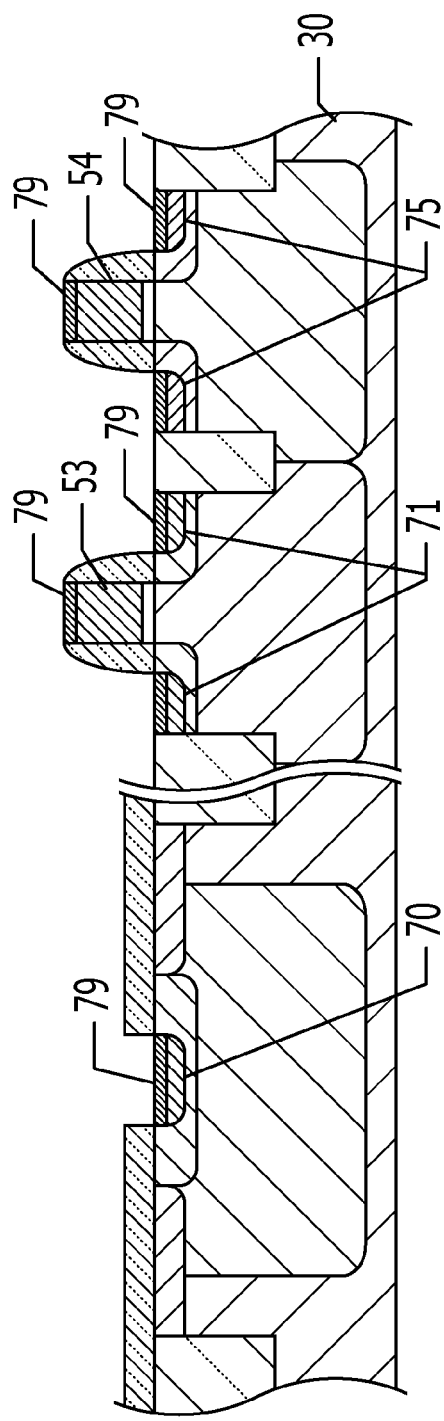

As illustrated in FIG. 4N, the metal silicide films 79 are formed on the top surfaces of the third diffusion region 70, the high concentration portions 71 and 75 of the sources and the drains, and the gate electrodes 53 and 54. A method for forming the metal silicide films 79 will be described below.

A cobalt film is formed by sputtering on the semiconductor substrate 30. The cobalt film has a thickness of, for example, 5 nm to 10 nm. Heat treatment is performed at about 500° C. to 700° C. This heat treatment forms the metal silicide film 79 composed of cobalt silicide (CoSi) at the interface between the cobalt film and the silicon surface. After the formation of the metal silicide films 79, an excess of the cobalt film is removed.

Figure 4O:
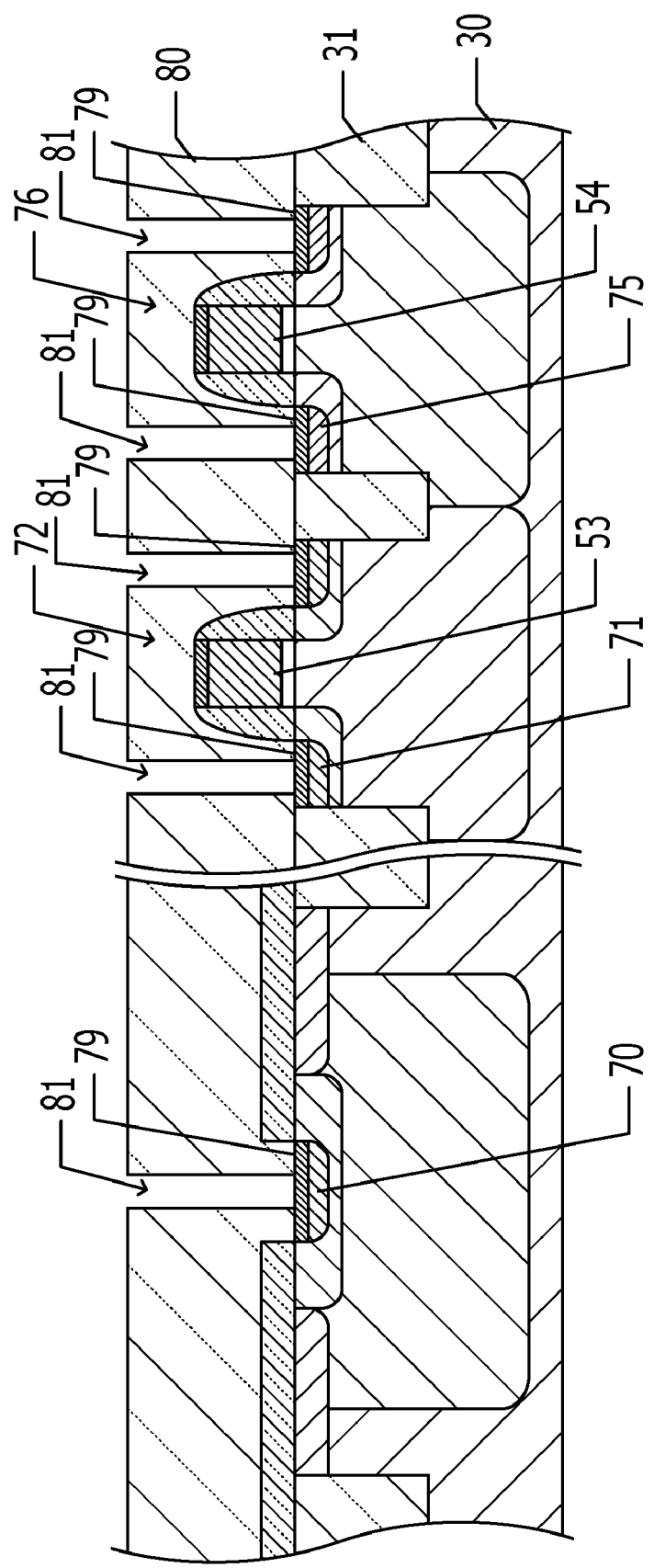

As illustrated in FIG. 4O, the interlayer insulation film 80 which is composed of silicon oxide and which has a thickness of 500 nm is formed by CVD on the semiconductor substrate 30. The interlayer insulation film 80 is subjected to chemical-mechanical polishing (CMP) to planarize the surface thereof. After the planarization, the interlayer insulation film 80 has a thickness of, for example, 200 nm with reference to the surface of the semiconductor substrate 30.

The via holes 81 are formed in the interlayer insulation film 80. The via holes 81 are arranged in portions corresponding to the third diffusion region 70, the high concentration portions 71 of the source and the drain of the NMOS transistor 72, and the high concentration portions 75 of the source and the drain of the PMOS transistor 76. Note that the via holes are also arranged in portions of the gate electrodes 53 and 54 located on the element isolation insulating regions 31, the portions being not illustrated in the cross-sectional view of FIG. 4O.

The metal silicide films 79 are exposed at the bottoms of all the via holes 81. It is thus possible to simultaneously form the via holes 81 under the same etching conditions.

As illustrated in FIG. 3, the conductive plugs 85 composed of, for example, tungsten are charged into the via holes 81. Furthermore, a multilayer wiring layer (not illustrated) is formed on the interlayer insulation film 80.

Figure 5A:
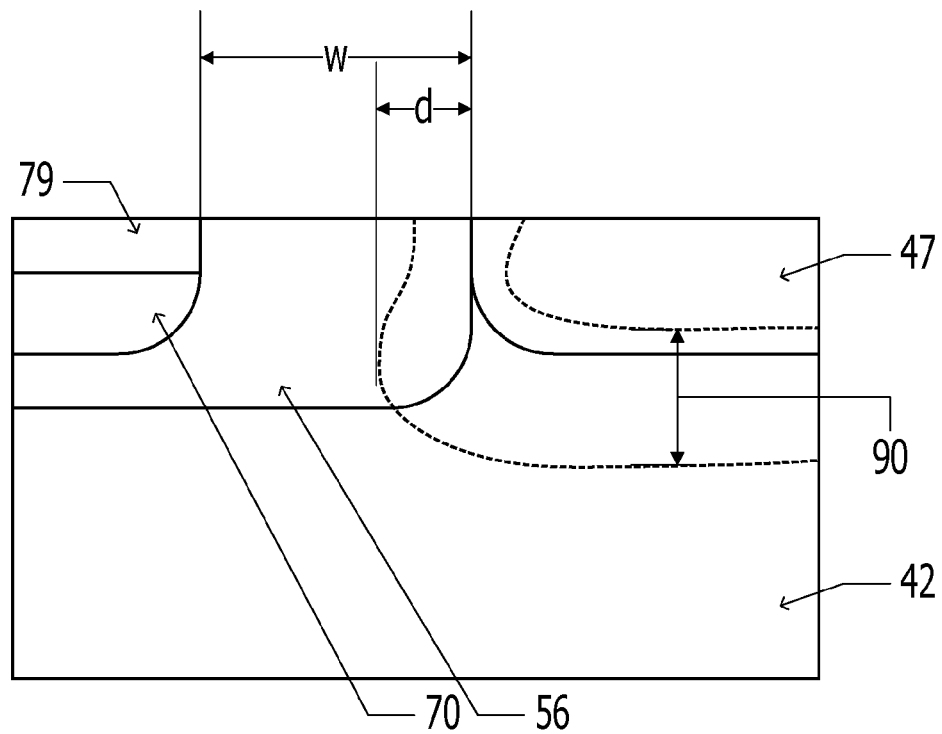
FIG. 5A is a cross-sectional view of the vicinity of a contact portion between a shielding layer and a second diffusion region.

FIG. 5A is a cross-sectional view of the vicinity of the contact portion between the shielding layer 47 and the second diffusion region 56. The third diffusion region 70 is formed in the second diffusion region 56. The metal silicide film 79 is formed on the top surface of the third diffusion region 70. The pn junctions are formed at interfaces between the p-type shielding layer 47 and the n-type first diffusion region 42 and between the p-type shielding layer 47 and the second diffusion region 56. The application of a reverse bias to the pn junctions allows a depletion layer 90 to extend from the pn junction interfaces toward the p-type region and the n-type region.

The distance from the interface between the shielding layer 47 and the second diffusion region 56 to the end of the depletion layer 90 extending transversely toward the second diffusion region 56 is defined as d. The distance between the shielding layer 47 and the metal silicide film 79 is defined as w.

Figure 5B:
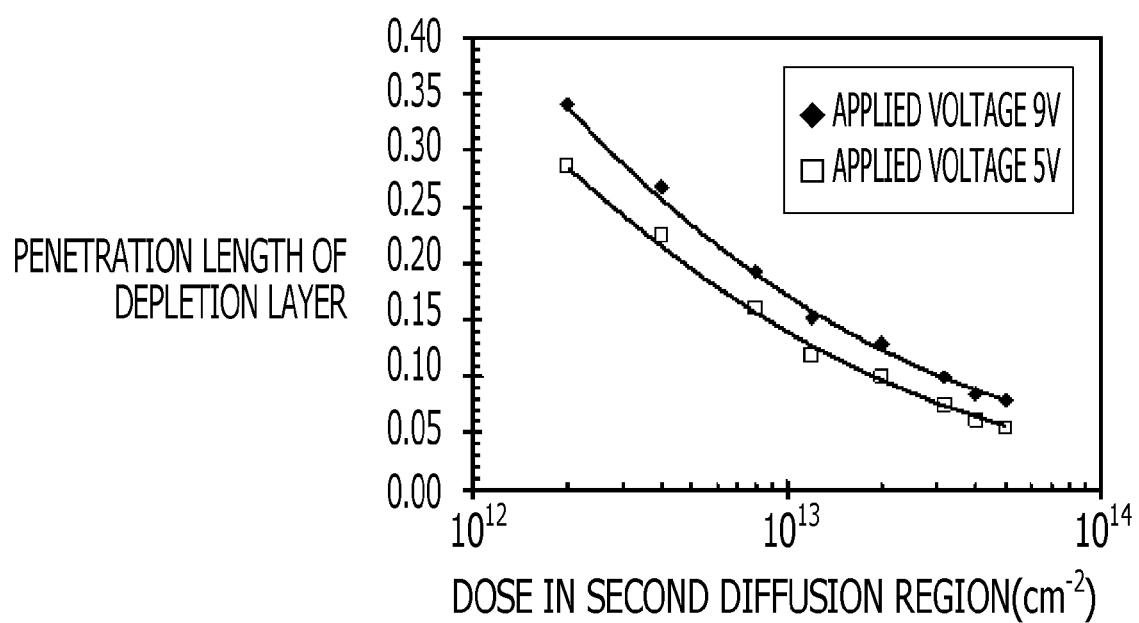
FIG. 5B is a graph illustrating the simulation results of the relationship between the dose in the second diffusion region and the penetration length d of a depletion layer.

FIG. 5B is a graph illustrating the relationship between the dose in the second diffusion region 56 and the penetration length d of the depletion layer 90. The horizontal axis indicates the dose in the second diffusion region 56, the dose being given in units of cm$^{-2}$. The vertical axis indicates the penetration length d of the depletion layer 90, the penetration length d being given in units of µm. In FIG. 5B, the penetration lengths d at a reverse bias of 9 V are represented by the closed rhombi, and the penetration lengths d at a reverse bias of 5 V are represented by the open squares, the penetration lengths d being determined by two-dimensional simulations.

The preconditions for the simulation are as follows: An impurity for the shielding layer 47 is boron implanted at an acceleration energy of 20 keV and a dose of $6 \times 10^{12}$ cm$^{-2}$. An impurity for the first diffusion region 42 is phosphorus implanted at an acceleration energy of 650 keV and a dose of $2\times10^{11}$ cm$^{-2}$. An impurity for the second diffusion region 56 is phosphorus implanted at an acceleration energy of 35 keV. The dose of phosphorus is changed in the range of $2\times10^{12}$ cm$^{-2}$ to $5\times10^{13}$ cm$^{-2}$.

In FIG. 5A, many defects are generally present in the vicinity of the metal silicide film 79. For the case where the depletion layer 90 extends to the vicinity of the metal silicide film 79 having a high defect density, a leakage current due to the defects is increased. To suppress the leakage current, the distance w is preferably longer than the penetration length d.

The penetration length d depends on the dose (impurity concentration) of the n-type impurity in the second diffusion region 56. A lower dose of the n-type impurity results in an increase in penetration length d. As illustrated in FIG. 4G, the second diffusion region 56 is simultaneously formed by the ion implantation step of forming the extension portions 55 of the source and the drain of the NMOS transistor. Thus, the acceleration energy and the dose in forming the second diffusion region 56 are determined by element properties required for the NMOS transistor. For example, in the case where the dose in the second diffusion region 56 is set to $3\times10^{13}$ cm$^{-2}$ and where the reverse bias is set to 5 V, the penetration length d is determined to be about 0.08 μm from FIG. 5B. In view of a positioning margin in forming the shielding layer 47 and the third diffusion region 70 and the distribution of defects around the metal silicide film 79, the distance w is preferably set to 1 μm or more.

More generally, the distance w and the impurity concentration in the second diffusion region 56 are preferably determined in such a manner that the end of the depletion layer 90 does not extend to the metal silicide films 79 when a reset voltage VR is applied to the pn junction of the photodiode PD.

An excessively large distance w causes an increase in the length of the boundary line between the shielding layer 47 and the second diffusion region 56 illustrated in the plan view of FIG. 2. An increase in the length of the boundary line leads to an increase in leakage current. Thus, it is not preferable to set the distance w to a value greater than required. For example, in FIG. 2, it is preferable to set the entire circumferential line of the second diffusion region 56 to ⅕ or less of the entire circumferential line of the photodiode active region 20, thereby providing a significant effect of suppressing a leakage current.

FIG. 6 illustrates the results from a two-dimensional simulation of the depletion layer generated in the photodiode PD of the semiconductor device according to the first embodiment. The preconditions for the simulation are as follows: The semiconductor substrate 30 has a resistivity of 10 Ωcm. An impurity in the first diffusion region 42 is phosphorus implanted at an acceleration energy of 650 keV and a dose of $2\times10^{13}$ cm$^{-2}$. An impurity in the second diffusion region 56 is phosphorus implanted at an acceleration energy of 35 keV and a dose of $3\times10^{13}$ cm$^{-2}$. An impurity in the third diffusion region 70 is phosphorus implanted at an acceleration energy of 8 keV and a dose of $8\times10^{15}$ cm$^{-2}$. An impurity in the shielding layer 47 is boron implanted at an acceleration energy of 20 keV and a dose of $6\times10^{12}$ cm$^{-2}$. The distance w between the shielding layer 47 and the third diffusion region 70 is 1.0 μm.

A pn junction interface 91 is formed at the boundary between the n-type region and the p-type region, the n-type region including the first diffusion region 42, the second diffusion region 56, and the third diffusion region 70, and the p-type region including the semiconductor substrate 30 and the shielding layer 47. When a reverse bias of 5 V is applied to the pn junction, the depletion layer 90 is generated. The depletion layer 90 serves as a light-receiving region.

The results demonstrate that the depletion layer 90 is localized in the vicinity of the boundary line between the shielding layer 47 and the second diffusion region 56, around the interface between the semiconductor substrate and the insulator layer. Furthermore, the depletion layer 90 does not extend to the metal silicide film 79, thus suppressing a leakage current.

The depletion layer 90 also extends transversely from the circumferential line of the first diffusion region 42. In FIG. 3, the distance between the first diffusion region 42 and a corresponding one of the element isolation insulating regions 31 is set in such a manner that the end of the depletion layer 90 extending transversely is not in contact with the element isolation insulating regions 31. For example, the distance between the circumferential line of the first diffusion region 42 and the outer end of the depletion layer 90 is about 1.5 μm. Preferably, the distance between the first diffusion region 42 and the corresponding element isolation insulating region 31 is surely set to be 3 μm or more.

A method for producing a semiconductor device according to a second embodiment will be described with reference to the FIGS. 7A and 7B. Points different from the first embodiment will be mainly described below.

FIG. 7A corresponds to the cross-sectional view of FIG. 4G illustrating the step according to the first embodiment. In the first embodiment, the shielding layer 47 is in contact with the second diffusion region 56. In the second embodiment, an opening formed in the resist pattern 57 is distant from the inner peripheral end of the shielding layer 47. Thus, the second diffusion region 56 is not in contact with the shielding layer 47. The region between the second diffusion region 56 and the shielding layer 47 has n-type conductivity because of the n-type impurity with which the first diffusion region 42 is doped. The other steps are identical to the corresponding steps according to the first embodiment.

Figure 7B:
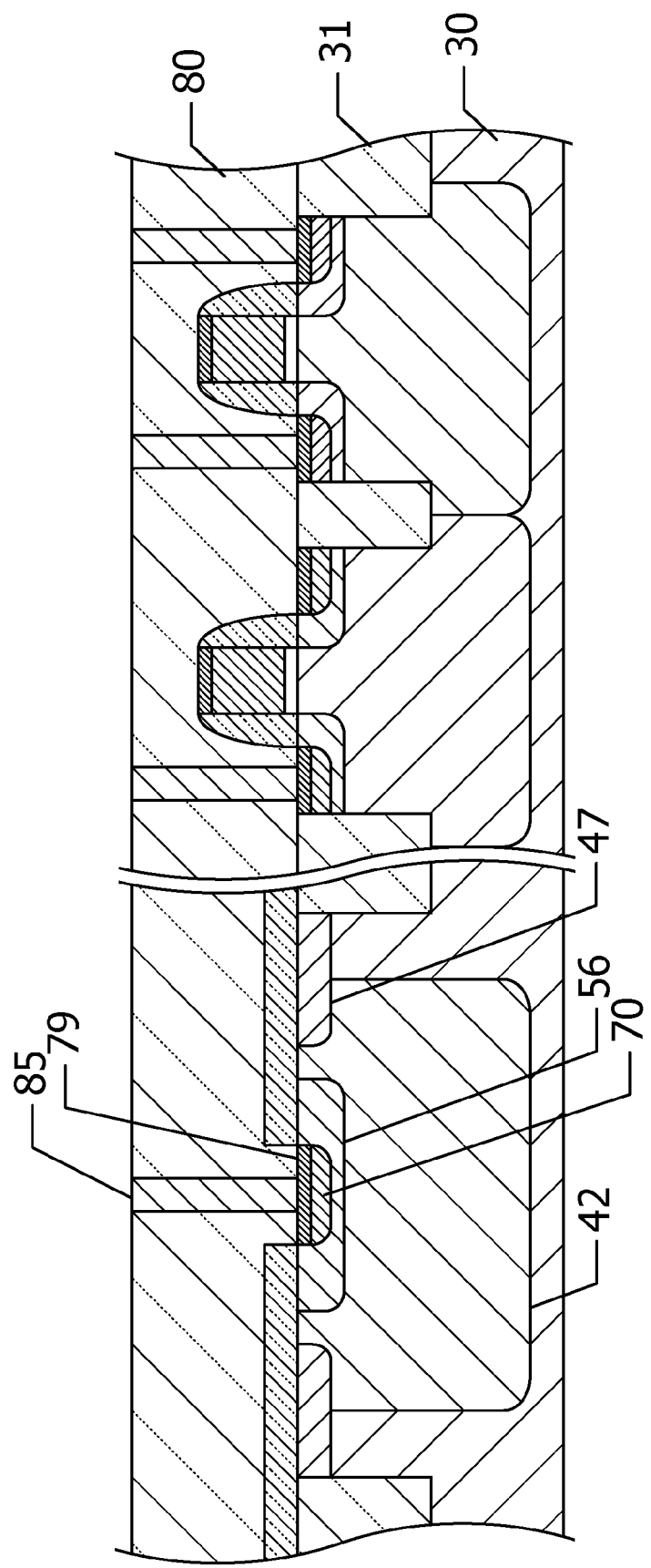
FIG. 7B is a cross-sectional view of the semiconductor device according to the second embodiment.

FIG. 7B corresponds to the cross-sectional view of FIG. 3 according to the first embodiment. The third diffusion region 70 is formed in the second diffusion region 56. The metal silicide film 79 is formed on the top surface of the third diffusion region 70. The conductive plug 85 is connected to the metal silicide film 79.

Figure 8:
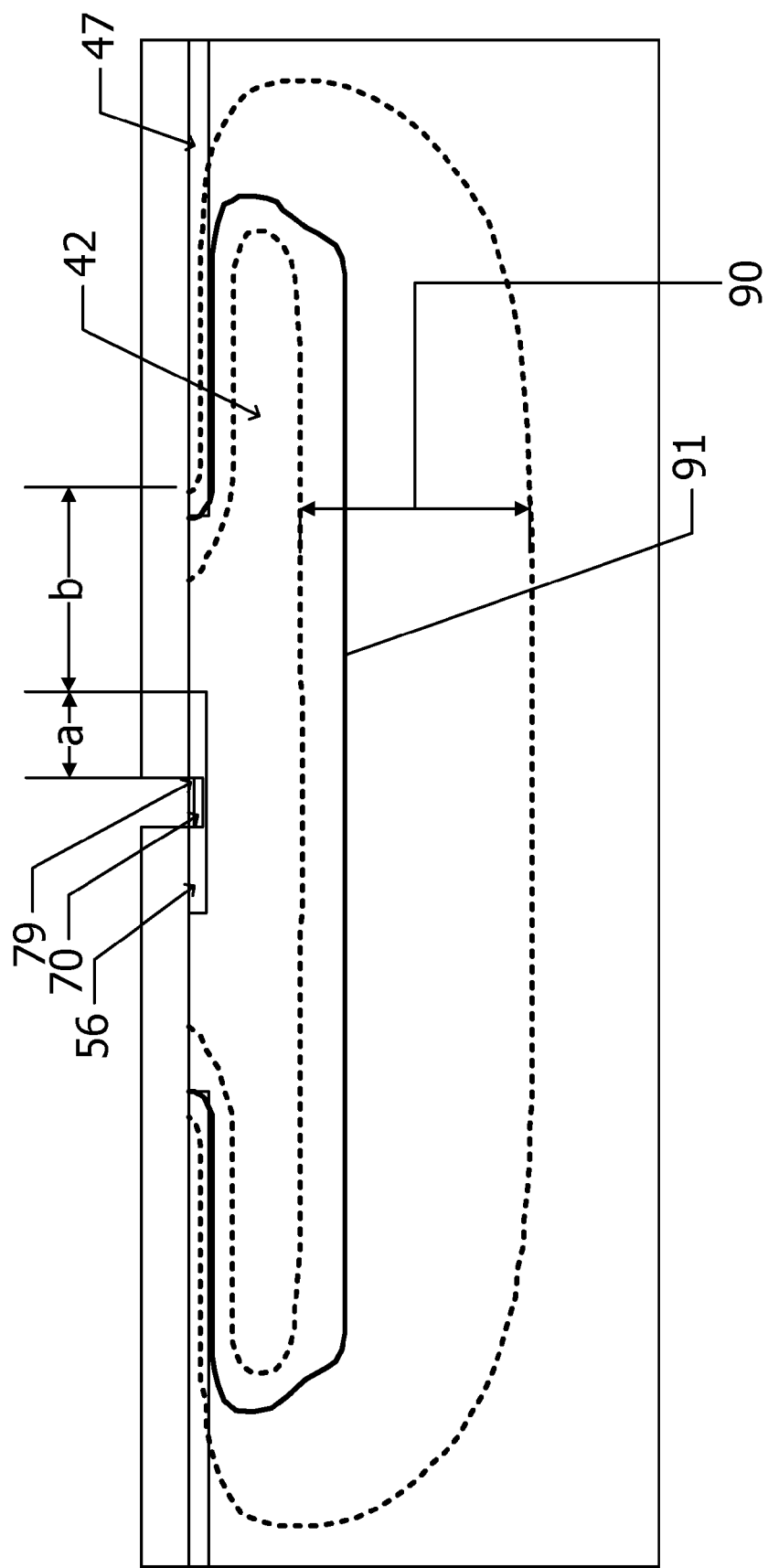
FIG. 8 is a diagram illustrating the simulation results of a depletion layer generated in a photodiode of a semiconductor device according to the second embodiment.

FIG. 8 illustrates the results from a two-dimensional simulation of a depletion layer generated in the photodiode PD of the semiconductor device according to the second embodiment. The implantation conditions of impurities implanted into the regions are identical to those in the case illustrated in FIG. 6. In this simulation, the distance b between the second diffusion region 56 and the shielding layer 47 is set to 2 μm. The distance a between the end of the third diffusion region 70 and the end of the second diffusion region 56 is set to 1 μm.

The depletion layer 90 is generated along the pn junction interface 91. The impurity concentration in the n-type region continuous with the pn junction interface corresponding to the inner peripheral end of the shielding layer 47 is lower than that in the first embodiment. This results in a longer penetration length of the depletion layer 90 extending from the inner peripheral end of the shielding layer 47 toward the n-type region. This corresponds to the case of a low dose in the second diffusion region 56 in FIG. 5B.

In the second embodiment, the distance a+b between the third diffusion region 70 (metal silicide film 79) and the shielding layer 47 is wider than the distance w of the corresponding portion of the semiconductor device according to the first embodiment. This prevents the depletion layer 90 from extending to the metal silicide films 79.

In the second embodiment, an electric field in the vicinity of the pn junction interface on the inner periphery side of the shielding layer 47 is weaker than that in the first embodiment. This makes it possible to suppress an increase in leakage current due to an intense electric field.

In the second embodiment, the second diffusion region 56 is not always required. That is, the third diffusion region 70 may be formed in the first diffusion region 42. Alternatively, the third diffusion region 70 may be omitted, and the metal silicide film 79 may be directly formed in the first diffusion region 42.

In the first and second embodiments, the surface layer portion of the semiconductor substrate 30 and the shielding layer 47 have p-type conductivity, and the first diffusion region 42, the second diffusion region 56, and the third diffusion region 70 have n-type conductivity. Alternatively, these conductivity types may be reversed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A semiconductor device comprising:
   a semiconductor substrate having at least one surface provided with a semiconductor element, wherein the semiconductor substrate includes a region of a first conductivity type, the region being formed in a surface layer portion of the semiconductor substrate;
   a first diffusion region of a second conductivity type, the first diffusion region having a first impurity concentration and being formed in the surface layer portion, and a pn junction being formed between the first diffusion region and the region of the first conductivity type;
   a first metal silicide film formed on a portion of the first diffusion region, coupled to a conductive plug extending above the first metal silicide film;
   a shielding layer of the first conductivity type, the shielding layer being formed so as to be separated from the first metal silicide film and so as to surround the first metal silicide film, and a pn junction being formed between the shielding layer and the first diffusion region; and
   an insulating pattern formed along an outer circumference of the first metal silicide film and on the upper side of the first metal silicide film and provided apart from the conductive plug.

2. The semiconductor device according to claim 1, further comprising: a second diffusion region of the second conductivity type, the second diffusion region having a second impurity concentration higher than the first impurity concentration and being formed between the first metal silicide film and the shielding layer.

3. The semiconductor device according to claim 2, further comprising: a third diffusion region of the second conductivity type, the third diffusion region having a third impurity concentration higher than the second impurity concentration and being formed between the first metal silicide film and the second diffusion region.

4. The semiconductor device according to claim 3, wherein the semiconductor element is a MOS transistor including a source, a drain, and a gate electrode, and a second metal silicide film composed of a material the same as that of the first metal silicide film is formed on at least the source and the drain.

5. The semiconductor device according to claim 4, wherein each of the source and the drain of the MOS transistor includes a high concentration portion and an extension portion of the second conductivity type, the extension portion is formed between the high concentration portion and a channel, a fourth impurity concentration of the second conductivity type in the extension portion being higher than a fifth impurity concentration of the second conductivity type in the high concentration portion, the depth of the second diffusion region is equal to the depth of the extension portion, the second impurity concentration of the second conductivity type in the second diffusion region is equal to the fourth impurity concentration of the second conductivity type in the extension portion, the depth of the third diffusion region is equal to the depth of the high concentration portion, and the third impurity concentration of the second conductivity type in the third diffusion region is equal to the fifth impurity concentration of the second conductivity type in the high concentration portion.

6. The semiconductor device according to claim 1, further comprising:
   an element isolation insulating film formed on the surface layer portion so as to surround the first diffusion region, wherein the interface of the pn junction between the first diffusion region and the region of the first conductivity type is spaced apart from the element isolation insulating film.

7. The semiconductor device according to claim 1, further comprising:
   a voltage-applying circuit configured to apply a reverse bias to the pn junction, wherein when a reverse bias is applied from the voltage-applying circuit to the pn junction, a depletion layer generated in the region of the pn junction does not extend to the first metal silicide film.

8. A semiconductor device comprising:
   a photodiode formed in a surface layer portion of at least one surface of a semiconductor substrate, the photodiode including a region of a first conductivity type, the region being formed in the surface layer portion;
   a conductive plug formed on the semiconductor substrate and connected to the photodiode, wherein the photodiode includes a first diffusion region of a second conductivity type, the first diffusion region being formed in the surface layer portion and having a first impurity concentration, a second diffusion region of the second conductivity type, the second diffusion region being formed in a region closer to the surface than the first diffusion region and having a second impurity concentration higher than the first impurity concentration, a third diffusion region of the second conductivity type, the third diffusion region being formed in a region closer to the surface than the second diffusion region and having a third impurity concentration higher than the second impurity concentration, a shielding layer of the first conductivity type, the shielding layer being formed in a region closer to the surface than the first diffusion region, the region being located outside the second diffusion region, and a first metal silicide film formed on the third diffusion region, spaced apart from the shielding layer, and being in direct contact with the conductive plug;

an insulating pattern formed along an outer circumference of the first metal silicide film and on an upper side of a first metal silicide film and provided apart from the conductive plug.

9. The semiconductor device according to claim 8, further comprising:
a MOS transistor formed in the surface layer portion, the MOS transistor including a source, a drain, and a gate electrode; and
a second metal silicide film formed on at least the source and the drain.

10. A semiconductor device comprising:
a semiconductor substrate having at least one surface provided with a semiconductor element, wherein the semiconductor substrate includes a region of a first conductivity type, the region being formed in a surface layer portion of the semiconductor substrate;
a first diffusion region of a second conductivity type, the first diffusion region having a first impurity concentration and being formed in the surface layer portion, and a pn junction being formed between the first diffusion region and the region of the first conductivity type;
a first metal silicide film formed on a portion of the first diffusion region;
a shielding layer of the first conductivity type, the shielding layer being formed so as to be separated from the first metal silicide film and so as to surround the first metal silicide film, and a pn junction being formed between the shielding layer and the first diffusion region;
an insulating pattern formed along an outer circumference of the first metal silicide film and on the upper side of the first metal silicide film; and
an interlayer insulation film formed above the first metal silicide film, a portion of the interlayer insulation film being in contact with the first metal silicide film.

11. The semiconductor device according to claim 10, further comprising a conductive plug formed in the interlayer insulation film.

12. The semiconductor device according to claim 8, further comprising, an interlayer insulation film formed above the first metal silicide film, a portion of the interlayer insulation film being in contact with the first metal silicide film.

* * * * *